HIGH SENSITIVITY AND POWER SIGNAL DETECTING DEVICE
Filed June 4, 1965 2 Sheets-Sheet 1
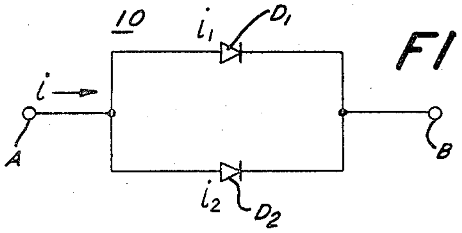
FIG. 1
FIG. 2
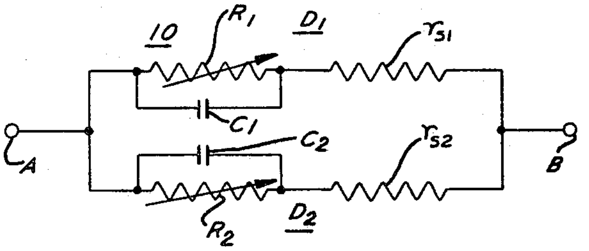
FIG. 3
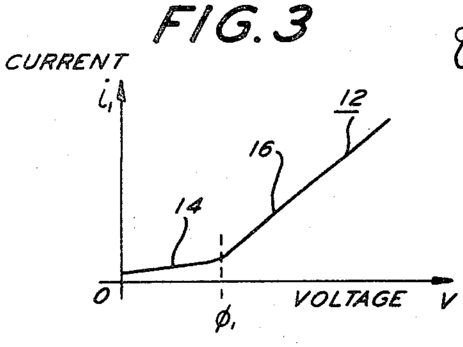
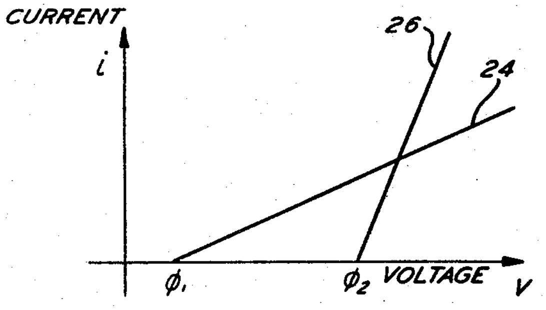
FIG. 6
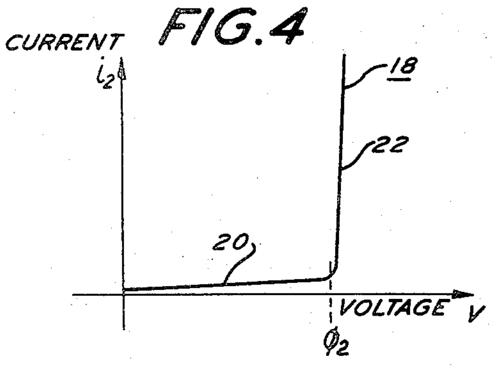
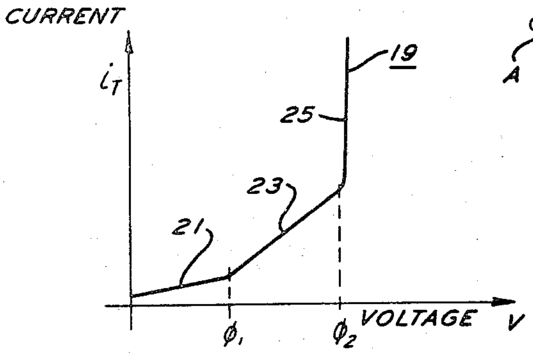
FIG. 5
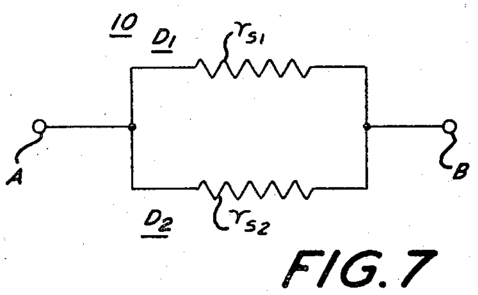
FIG. 7
INVENTORS
LEON RIEBMAN
FRANK E. McDONNELL
BY
Jacob Trachtman
ATTORNEY Dec. 24, 1968 L. RIEBMAN ET AL 3,418,587

HIGH SENSITIVITY AND POWER SIGNAL DETECTING DEVICE

Filed June 4, 1965 2 Sheets-Sheet 2

INVENTORS
LEON RIEBMAN
FRANK E. McDONNELL
BY
Jacob Trachtman
ATTORNEY

United States Patent Office 3,418,587
Patented Dec. 24, 1968

3,418,587

HIGH SENSITIVITY AND POWER SIGNAL DETECTING DEVICE

Leon Riebman, Huntingdon Valley, and Frank E. McDonnell, Lansdale, Pa., assignors to American Electronic Laboratories, Inc., Colmar, Pa., a corporation of Pennsylvania
Filed June 4, 1965, Ser. No. 461,441
17 Claims. (Cl. 329—205)

ABSTRACT OF THE DISCLOSURE

The device comprises a plurality of semiconductor diodes connected in parallel, a first diode having a signal sensitivity greater than that of a second diode, while the second diode has a power handling capacity greater than that of the first diode. The first diode has a spreading resistance greater than that of the second diode while the second diode has a contact potential greater than the contact potential of said first diode, said combination of diodes providing a nonlinear voltage current characteristic, whereby the first diode handles a greater portion of the signal power than the second diode when the device receives signals at a first power level, while the second diode handles a greater portion of signal power when said device receives signals at a second power level greater than said first power level and without exceeding the power handling capability of the first diode of the device.

Figure 8:
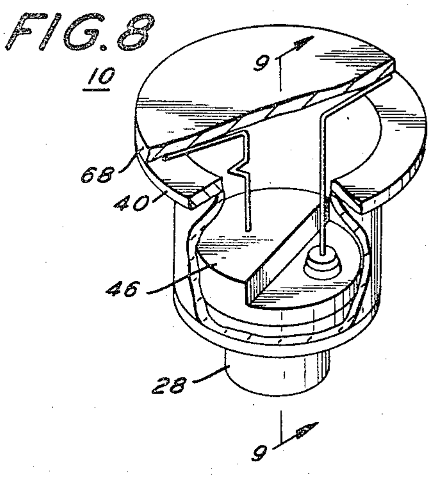

The invention relates to a signal detecting device, and more particularly to a device for detecting amplitude modulation of a signal and having high sensitivity and a high power handling capability.

Heretofore, video detector diodes have been available which are capable of providing excellent sensitivity when used in properly designed radio frequency and video circuits. Such diodes have not been capable of dissipating large amounts of radio frequency power without adversely altering their characteristics. Other diodes which are capable of dissipating large amounts of radio frequency power, however, are considerably less sensitive. Therefore, to date an undesirable compromise must be made between sensitivity and power handling capability. This fact is indicated in Table 1 below, which lists sensitivity, frequency and power handling ability.

TABLE 1

| R.F. frequency (gc./sec.) | Peak power watts (.001 duty cycle, 1 k sec.) 6 | 30 | 65 | 160 | 600 | 1,000 |
|---|---|---|---|---|---|---|
| | Tangential sensitivity (−dbm) | | | | | |
| 2 | 65 | 55 | 54 | 52 | 47 | 45 |
| 4 | 63 | 53 | 52 | 51 | 46 | 44 |
| 6 | 62 | 51 | 50 | 49 | 45 | 43 |
| 8 | 61 | 49 | 48 | 47 | 43 | 42 |
| 10 | 60 | 47 | 46 | 45 | 42 | 41 |

On the other hand, the signal detecting device embodying the invention provides high sensitivity as well as high power handling capability as is indicated by the following Table 2.

TABLE 2

| R.F. Frequency (gc./sec.) | Peak power watts (.001 duty cycle, 1 k sec.), 1,000 watts, Tangential sensitivity (−dbm) |
|---|---|
| 2 | 62 |
| 4 | 60 |
| 6 | 59 |
| 8 | 58 |
| 10 | 57 |

The above Table 2 indicates the sensitivity and power handling characteristics of the signal detecting device for the present state of the art. However, with the development of higher sensitivity detectors, improvements can be directly incorporated into the signal detecting device of the present invention.

It is therefore a principal object of the invention to provide a new and improved signal detecting device for detecting amplitude modulation providing both high signal sensitivity and high power handling capacity.

Another object of the invention is to provide a new and improved signal detecting device for detecting amplitude modulation which is capable of providing increased sensitivity as developments occur which yield higher sensitivity detectors while still allowing the handling of high power without adversely altering the characteristics of the device.

Another object of the invention is to provide a new and improved signal detecting device of high sensitivity which will not be damaged by the application of high power, such as would result in burnout or adverse change in the characteristics of present art high sensitivity detector devices.

Another object of the invention is to provide a new and improved signal detecting device which may be readily fabricated using presently known techniques for producing high sensitivity diodes, and low sensitivity diodes with high power handling capability.

Another object of the invention is to provide a new and improved signal detecting device which is readily constructed, efficient in operation, and has a long operational lifetime.

The above objects as well as any other objects of the invention are achieved by providing a signal detecting device comprising first and second parallel connected semiconductor diodes in which the first diode has a signal sensitivity greater than that of the second diode while the second diode has a power handling capability greater than that of the first diode. The first diode also has a spreading resistance greater than that of the second diode, while the second diode has a contact potential and barrier resistance greater than the contact potential and barrier resistance respectively of the first diode.

The first diode handles a greater portion of the signal power than the second diode when the device receives signals at a first predetermined power level, while the second diode handles a greater portion of the signal power than the first diode when the device receives signals at a second predetermined power level greater than the first power level, without exceeding the power handling capability of the first diode.

Figure 9:
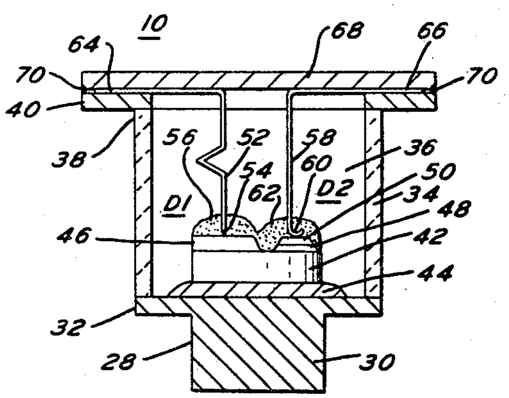
Figure 10:
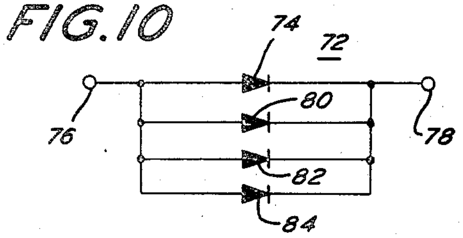
Figure 11:
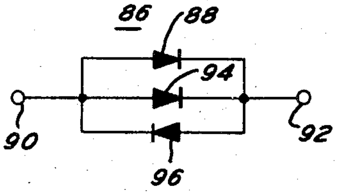
Figure 12:
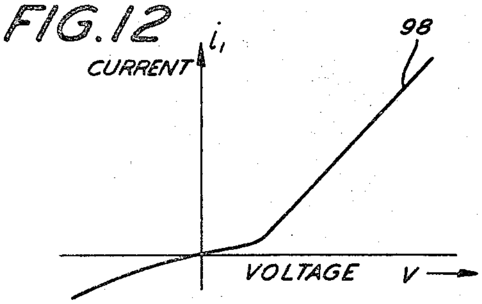
Figure 13:
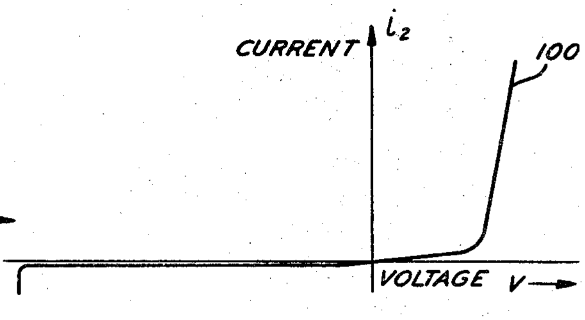
Figure 14:
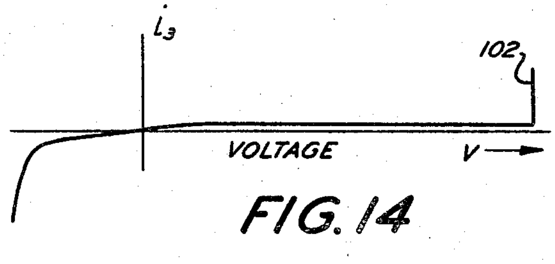
Figure 15:
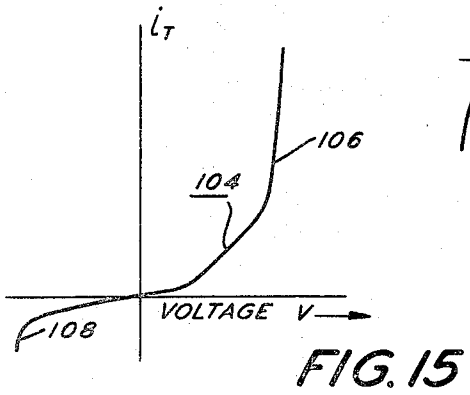

The foregoing and other objects of the invention will become more apparent as the following detailed description of the invention is read in conjunction with the drawings, in which:

FIGURE 1 is a schematic representation of the signal detecting device embodying the invention, FIGURE 2 is a schematic representation of the equivalent circuit of the circuit shown in FIGURE 1, FIGURE 3 is a graphic representation of the current voltage characteristic of the high sensitivity diode of FIGURE 1, FIGURE 4 is a graphic representation of the current voltage characteristic of the parasitic or high power diode of the device shown in FIGURE 1, FIGURE 5 is a graphic representation of the current voltage characteristics of the device shown in FIGURE 1, combining the individual characteristics shown in FIGURES 3 and 4, FIGURE 6 is a graphic representation of the approximated current voltage characteristics respectively of the high sensitivity diode and high power diode of the device shown in FIGURE 1, utilized in connection with the theoretical exposition of the signal detecting device, FIGURE 7 is a schematic diagram of the equivalent circuit of the device shown in FIGURE 1 under high power handling conditions, FIGURE 8 is a perspective view with portions cut away and epoxy material omitted, illustrating an embodiment of the device shown in FIGURE 1, FIGURE 9 is a sectional view taken on the line 9—9 of FIGURE 8, including epoxy material, FIGURE 10 is a schematic illustration of a signal detecting device which is a modified form of the signal detecting device shown in FIGURE 1, FIGURE 11 is another signal detecting device which is a modified form of the device shown in FIGURE 1, FIGURE 12 is a graphic representation of the current voltage characteristic of the high sensitivity diode of the device shown in FIGURE 11, FIGURE 13 is a graphic representation of the current voltage characteristic of the first high power diode of the device shown in FIGURE 11, FIGURE 14 is a graphic representation of the current voltage characteristic of the oppositely poled second high power diode of the device shown in FIGURE 11, and FIGURE 15 is a graphic representation of the total current voltage characteristic of the device shown in FIGURE 11, constituting the sum of the current voltage characteristics illustrated in FIGURES 12, 13 and 14.

Like references designate like parts throughout the several views.

Refer to FIGURE 1 which schematically illustrates a signal detecting device 10 embodying the invention, The device 10 has a pair of terminals A and B between which are connected in parallel a first high sensitivity semiconductor diode $D_1$, and a second semiconductor diode $D_2$ having high power handling capability. The diode $D_2$ although having high power handling capability does not have the high sensitivity characteristic provided by the diode $D_1$, while the diode $D_1$ although provided with a high sensitivity, does not have the power handling capabilities of diode $D_2$. In this connection, it is noted that point contact semiconductor diodes provides the high sensitivity and low power handling capabilities of the diode $D_1$, while junction diodes provide the characteristic of low sensitivity and high power handling capability characterizing diode $D_2$.

The diode $D_1$ is further characterized by having a spreading resistance greater than the spreading resistance of the diode $D_2$, while the high powered or parasitic diode $D_2$ has a contact potential and barrier resistance greater than the contact potential and barrier resistance respectively of the diode $D_1$. The above properties for diodes $D_1$ and $D_2$ may also be provided respectively by point contact and junction diodes. The further detailed relationships between the spreading resistance and contact potentials of the diodes $D_1$ and $D_2$ for the purpose of the invention will be described below in connection with FIGURES 3 to 6 inclusive.

FIGURE 2 schematically illustrates the equivalent circuit for the circuit of the signal detecting device 10 shown in FIGURE 1. Thus, the high sensitivity diode $D_1$ includes a barrier resistance $R_1$ which varies as a function of the potential applied across the diode $D_1$. The capacitance $C_1$ shown in parallel with the barrier resistance $R_1$, represents the barrier capacitance of the diode $D_1$. The spreading resistance of $r_{S1}$ of the diode $D_1$ is connected in series with the parallel connector barrier resistance $R_1$ and barrier capacitance $C_1$ and includes the resistance of the semiconductor material.

The high power or parasitic diode $D_2$ has an equivalent circuit similar to the semiconductor diode $D_1$, including a barrier resistance $R_2$ which varies with the voltage applied across the diode $D_2$ and a barrier capacitance $C_2$ connected in parallel therewith, as well as a spreading resistance $r_{S2}$ connected in series therewith.

FIGURE 3 illustrates in graphic form the current voltage characteristic of high sensitivity diode $D_1$ with the application of voltage across the terminals A and B in the forward direction of the diode $D_1$. The curve 12 of FIGURE 3 comprises a first portion 14 produced when the voltage is less than the contact potential $\phi_1$ of the diode $D_1$, and a second portion 16 of greater slope characterizing the current flow when the applied forward voltage exceeds the contact potential $\phi_1$. The slope of the portion 16 of the curve 12 is inversely related to the spreading resistance $r_{S1}$ of the diode $D_1$.

The high power diode $D_2$ as seen from FIGURE 4 is characterized by a curve 18 illustrating the current voltage characteristic for the application of voltage in forward direction across the diode $D_2$. The curve 18 also provides a portion 20 of low current, characterizing the high resistance of the diode $D_2$ for voltages below the contact potential $\phi_2$ of the diode $D_2$. The second portion 22 of the curve 18 illustrates the current characteristic when the voltage exceeds the contact potential $\phi_2$. The slope of the portion 22 is inversely related to the spreading resistance $r_{S2}$. Thus, from the graphic illustrations it is evident that the contact potential $\phi_1$ of the diode $D_1$ has a lower value than the contact potential $\phi_2$ of the high power diode $D_2$. By the portions 14 and 20 respectively of graphs 12 and 18 of FIGURES 3 and 4, the diode $D_1$ is illustrated as having a lower barrier resistance than the diode $D_2$ and to dissipate a higher portion of the current delivered to the signal detecting device 10 when the voltage V is less than the contact potential $\phi_2$. A comparison of the slopes of the portion 16 and 22 respectively of the curves 12 and 18 in FIGURES 3 and 4 also illustrates the spreading resistance $r_{S1}$ of diode $D_1$ to have a greater value of resistance than the spreading resistance $r_{S2}$ of the high power diode $D_2$.

FIGURE 5 illustrates graphically the total current versus voltage characteristic of device 10 with the voltage applied in the forward direction to the device 10 combining the characteristics illustrated by the graphs of FIGURES 3 and 4. The portion 21 in the curve 19 illustrates the current voltage characteristic of the device 10 for applied voltages having values less than the contact potential $\phi_1$ of the diode $D_1$, while the portion 23 shows the characteristic of the device 10 for applied voltages having values between the contact potential $\phi_1$ and $\phi_2$ of the diodes $D_1$ and $D_2$. For high power signals in which the applied voltage to the device 10 exceeds the contact potential $\phi_2$ of the diode $D_2$, the portion 25 illustrates the low spreading resistance provided by the diode $D_2$ for dissipating a greater portion of the power dissipated by the device 10 and preventing the burn out of the high sensitivity low power diode $D_1$.

Qualitatively describing the operation of the signal detecting device 10, when a signal such as a radio frequency signal having low power is delivered to the terminals A and B of the device 10, a power division takes place between the diodes $D_1$ and $D_2$ with a current $i_1$ of the total current $i$ delivered to the device 10 being received by the diode $D_1$ while a current $i_2$ flows through the high power or parasitic diode $D_2$. At this time, to obtain a most efficient operation of the device 10 maximum current should be delivered through the high sensitivity diode $D_1$, while current through diode $D_2$ should be minimized. As illustrated by the graphs of FIGURES 3 and 4 with the radio frequency power delivering signal voltages less than the contact potential $\phi_2$ of the parasitic high power diode $D_2$, a greater portion of the current $i$ flows through the high sensitivity diode $D_1$, while a smaller fraction of the total current passes through the parasitic diode $D_2$ for providing high efficiency during receipt of low power signals.

When a high power signal is received by the device 10 its application to terminals A and B provides a voltage exceeding contact potential $\phi_2$ of the high power diode $D_2$. Since the parasitic diode $D_2$ has lower spreading resistance than the high sensitivity diode $D_1$ this results in diode $D_2$ conducting therethrough a greater portion of the total current $i$. Thus, the parasitic diode $D_2$ operates to dissipate a greater proportion of the power dissipated by the device 10 limiting the power dissipated by the high sensitivity diode $D_1$ and thereby protecting same against burnout or undesirable alteration of its characteristics.

The following theoretical explanation of the operation of the signal detecting device 10 may be divided into the theory of low level power division for determining the sensitivity of the device 10, and the theory of high level power division for establishing the burnout characteristics of the device 10.

In considering the theory of low level power division, a first approximation is helpful in which the device 10 is analyzed as a combination of two parallel diodes including the high sensitivity diode $D_1$ and the high power parasitic diode $D_2$ as illustrated in FIGURE 1, in which the diode $D_1$ may be considered a point contact diode and diode $D_2$ is a junction diode. The expression for current through a point contact or junction diode may be expressed as a function of the voltage applied across its external terminals A and B by the following equation:

$$i=I_0e^{-\alpha\phi}[e^{\alpha(V_o-ir_S)}-1] \quad (1)$$

in which $i$ and $V_o$ are respectively the terminal current and voltage; $\alpha$ is a constant proportional to $q/KT$; $I_o$ is a constant of proportionality; $r_S$ is the series resistance of the device exclusive of the barrier resistance and is commonly referred to as the spreading resistance; and $\phi$ is the contact potential of the diode under consideration.

Radio frequency power P, incident on the device 10 at its terminals A and B, causes a current $i=i_1+i_2$ to flow, with a power division proportional to the current division according to the following equation:

$$P_{in}=V_oi=V_o(i_1+i_2) \quad (2)$$

Assuming that the spreading resistance $r_{S1}$ of the diode $D_1$ is equal to 200 times the spreading resistance $r_{S2}$ of the diode $D_2$ where the spreading resistance of the diode $D_2$ has a value of one ohm, the Equation 2 gives the following expressions:

$$i_1=I_1e^{-\alpha\phi_1}[e^{\alpha(V_o-i_1 200)}-1] \quad (3a)$$

$$i_2=I_2e^{-\alpha\phi_2}[e^{\alpha(V_o-i_2)}-1 \quad (3b)$$

The ratio of the currents $i_1$ and $i_2$ respectively through the diodes $D_1$ and $D_2$ provides an expression for the ratio of power dissipated by the respective diodes $D_1$ and $D_2$ as follows:

$$\frac{i_1}{i_2}=\frac{I_1}{I_2}e^{\alpha(\phi_2-\phi_1)}\left[\frac{e^{\alpha(V_o-200i_1)}-1}{e^{\alpha(V_o-i_2)}-1}\right] \quad (4)$$

Using the approximation where $$[e^{\alpha(V-ir_S)}-1]\cong\alpha(V_o-ir_S)\cong\alpha V_o$$

under restriction that $ir_S$ is much less than $V_0$, the above Equation 4 reduces to the following expression:

$$\frac{i_1}{i_2}\cong\frac{I_1}{I_2}e^{\alpha(\phi_2-\phi_1)} \quad (5)$$

The above approximation is justified by considering a typical diode such as type AEL–12 of American Electronic Laboratories, Inc., where $V_o$ at the operating point is approximately .25 volt, $r_S$ is approximately equal to 200 ohms, and $i$ is approximately equal to $5\times10^{-6}$ amps.

If we define $P_1$ equal to $i_1V_o$, $P_2$ equal to $i_2V_o$ and $\lambda$ equal to $P_1/P_2$, then:

$$\lambda=\frac{I_1}{I_2}e^{\alpha(\phi_2-\phi_1)} \quad (6)$$

There are two major points to consider when interpreting the above equation with respect to the physics of the device 10 which are as follows:

(a) The leakage current of the parasitic diode $D_2$ should be small relative to the leakage current of the high sensitivity diode $D_1$ of the signal detecting device 10, and, (b) The contact potential $\phi_2$ of the parasitic diode $D_2$ should be as large as possible, and the contact potential $\phi_1$ of the high sensitivity diode $D_1$ should be as small as possible to achieve the desired sensitivity characteristic.

When burnout of the sensitive diode $D_1$ of the device 10 is considered, there is a restriction on how large $\lambda$ can be made. If $\lambda$ is too large, then, before the parasitic or high power diode $D_2$ can absorb an appreciable amount of incident power, thus providing protection for the high sensitivity diode $D_1$, the diode $D_1$ is burned out.

One method of obtaining a large $\lambda$, as evidenced by Equation 8, is to increase the difference $(\phi_2-\phi_1)$. This can be accomplished either by making $\phi_2$ large, $\phi_1$ small, or both. However, in view of the burnout considerations discussed above, there must be an upper limit placed upon the magnitude of $(\phi_2-\phi_1)$.

As a first approximation in determining this limiting value, make the following assumptions:

$$i=0 \text{ for } V<\phi \quad (7a)$$

$$i=\frac{V-\phi}{r_S} \text{ for } V>\phi \quad (7b)$$

Under the above conditions and assumptions the respective currents are given as follows for diodes $D_1$ and $D_2$.

$$i_1=\frac{V-\phi_1}{r_{S1}} \quad (8a)$$

$$i_2=\frac{V-\phi_2}{r_{S2}} \quad (8b)$$

Consider FIGURE 6 in which the above equation for $i_1$ is given by the line 24 having a slope equal to the reciprocal of the spreading resistance $r_{S1}$ of diode $D_1$. The line 26 in the graph FIGURE 6 also represents the equation for $i_2$ and has a slope equal to the reciprocal of the spreading resistance $r_{S2}$ of the diode $D_2$.

Considering a typical junction diode for the parasitic or high power diode $D_2$, such as type AEL–30E of American Electric Laboratories, Inc., rated at one watt with a spreading resistance $r_{S2}$ equal to approximately one ohm then:

$$P_2=(i_2)^2r_{S2}=\frac{(V-\phi_2)^2}{r_{S2}}=1 \text{ watt} \quad (9)$$

Since $r_{S2}$, the spreading resistance of $D_2$, is equal to one ohm, $$(V-\phi_2)=1 \text{ volt}$$

Considering a typical point contact diode for the high sensitivity diode $D_1$ such as the type AEL–12 of American Electronic Laboratories, Inc., rated for .2 watt with a spreading resistance $r_{S1}$ equal to 200, then $$P_1=(i_1)^2 r_{S1}=\frac{(V-\phi_1)^2}{r_{S1}} \quad (10)$$

Since the spreading resistance $r_{S1}=200$ ohms and $V=1+\phi_2$, $$(\phi_2-\phi_1=5.3 \text{ volts}$$

Under the worst case assumption in which $P_1$ equals $P_{total}$ at $i_2 \leqslant i_1$ the maximum power in diode $D_1$ is $$P_1 \leq \frac{\phi_2^2}{r_{S1}}=0.140 \text{ watts if } \phi_1=0 \quad (11)$$

Thus it is possible to specify a safe value of $(\phi_2-\phi_1)$ equal to or less than 5.3 volts for the particular diodes $D_1$ and $D_2$ under consideration in the above example.

On physical considerations the contact potential $\phi_1$ of the diode $D_1$ can be made to approach zero by appropriate choice of metal-semiconductor interface material. Then one of the largest contact potentials in a semiconductor available at present, useful at room temperatures, is found in gallium phosphide, having 2.2 ev. This does not preclude using high $\phi$ materials, but merely indicates that all materials available today are within the theoretical limit established for $(\phi_2-\phi_1)$. These conditions are represented graphically by FIGURES 3, 4 and 5 considered above.

The threshold sensitivity $P_{ST_1}$ (in −dbm) is related to the power $P_1$ in watts dissipated by the diode $D_1$ by the following expression:

$$P_{ST_1}=10 \log_{10} \frac{P_1}{10^{-3}} \quad (12)$$

Then, including the sensitivity degradation due to the parasitic diode $D_2$, the resultant threshold sensitivity of the device 10 may be determined by using the following equation:

$$P_{ST_1}(-\text{dbm})=10 \log_{10} \frac{P_1}{10^{-3}}\left(1+\frac{1}{\lambda}\right) \quad (13)$$

Considering now the power handling capability of the signal detecting device 10, when high power is incident on the device 10 in the forward direction, the effective impedence of each diode $D_1$ and $D_2$ under such conditions is its respective spreading resistance $r_{S1}$ and $r_{S2}$ as illustrated schematically in the equivalent circuit of FIGURE 7 for the device 10. If the voltage $V_o$ is applied to the terminals A and B of the device 10, then the total power which must be dissipated by the device 10 is:

$$P_T=\frac{V_o^2(r_{S1}+r_{S2})}{r_{S1}r_{S2}} \quad (14)$$

The power in each diode $D_1$ and $D_2$ of the device 10 follows from the above equation as $$P_T=P_1+P_2=\frac{V_o^2}{r_{S1}}+\frac{V_o^2}{r_{S2}} \quad (15)$$

Experimental evidence indicates that in connection with a typical high sensitivity diode $D_1$ such as the type AEL-12, the typical average power which the spreading resistance $r_{S1}$ can dissipate without adversely altering the diode characteristics is 200 mw. and the peak power is 5 watts, with a one microsecond pulse width and a .001 duty cycle.

To determine the relationship between spreading resistance $r_{S1}$ and the spreading resistance $r_{S2}$ respectively of the diode $D_1$ and $D_2$ to permit the signal detecting device 10 to safely handle 1000 peak watts, let $$r_{S2}=\delta r_{S1} \quad (16)$$

Then by substituting this relationship in Equation 14 above gives:

$$P_T=\frac{V_o^2(1+\delta)r_{S1}}{\delta r_{S1}^2}=\frac{V_o^2}{r_{S1}}\frac{(1+\delta)}{\delta}=1000 \text{ watts} \quad (17)$$

Since the high sensitivity diode $D_1$ can only handle five peak watts $$P_1=\frac{V_o^2}{r_{S1}}=5 \text{ watts} \quad (18)$$

and $$P_T=1000 \text{ watts}=\frac{5(1+\delta)}{\delta} \quad (19)$$

Under these conditions $$\delta \cong \frac{1}{200} \quad (20)$$

and $$r_{S1}=200 r_{S2} \quad (21)$$

This justifies the assumption made in connection with Equations 3*a* and 3*b*. The diode characteristic corresponding to the conditions of Equation 6 and Equation 21 are indicated in FIGURES 3, 4 and 5.

Consider now FIGURES 8 and 9 which illustrate a practical embodiment of the signal detecting device 10. The signal device 10 comprises a base portion 28 made of a highly conducting metallic material such as provided by a copper base alloy providing an extending cylindrical section 30 and a top base plate 32. A cylindrical wall portion 34 which may be made of a ceramic material having high electrical insulating properties is hermetically sealed with the base plate 32 of the base portion 28 to provide an internal chamber 36. The top 38 of the wall section 34 is hermetically sealed to a ring member 40 which is made of a highly conducting material such as the material of the base portion 28. A semiconductor substrate which may be highly doped silicon to provide a high acceptor concentration is joined to the base plate 32 by a nickel gold alloy 44 providing a good ohmic contact between the substrate 42 and the base portion 28. An epitaxial film 46 may be deposited on the substrate 42 from a vapor phase in the well-known manner. The epitaxial film 46 may be of silicon material having a resistivity higher than that of the substrate 42 and a lower acceptor carrier concentration. A second epitaxial film 48 may be deposited on the substrate 42 at the same time film 46 is deposited but at a different location from the epitaxial film 46, with the film 48 being identical in composition and characteristics to the epitaxial film 46. A diffused or alloyed N type region with a high barrier resistance is provided at the layer of material 50 over the P type layer of material of film 48, as provided by well-known techniques.

In order to provide the high sensitivity contact diode $D_1$, an electrically conductive wire or lead 52 is positioned with its end 54 in contact with the epitaxial film 46. The lead 52 is retained in contact with the film 46 by the epoxy material 56. This provides a point contact diode $D_1$ having high sensitivity but limited in its power handling capabilities.

A second conductive wire or lead 58 has its end 60 positioned in contact with the region or layer of material 50 by epoxy material 62 for providing with the epitaxial film 48 a junction diode $D_2$ characterized by its low sensitivity and high power handling capabilities.

The ends 64 and 66 respectively of the leads 52 and 58 are electrically connected with the ring 40 and the chamber 36 is hermetically sealed by the welding of a conductive metallic top plate 68 about its periphery 70 with the conductive ring 40. If desired the chamber 36 may be filled with a potting compound in addition to being hermetically sealed.

The form of the signal detecting device 10 illustrated in FIGURES 8 and 9 provides better performance by including the diodes $D_1$ and $D_2$ in an integrated structure and within the unitary enclosure by preventing variation in parasitics which might otherwise be prevalent. Of course, the above is a particular example of the structure of the device 10, however, the signal detecting device 10 may be fabricated in various other forms to provide the advantages of high sensitivity and high power handling capacity.

FIGURE 10 schematically illustrates a signal detecting device 72 which is a modification of the device 10 shown in FIGURE 1. In the illustrated form of device 72, a high sensitivity diode 74 is connected between terminals 76 and 78 of the device, while a high power handling diode 80 is connected in parallel therewith. The diode 74 and diode 80 have the same relative characteristics as the diodes $D_1$ and $D_2$ of the device 10. Thus, the diode 80 has a higher barrier resistance than the diode 74 as well as a higher contact potential, while the diode 74 has a higher spreading resistance than the diode 80.

In order to allow for greater dissipation of power than afforded by the device 10, an additional high power diode 82 is connected in parallel with diodes 74 and 80 and has a contact potential greater than the contact potential of the diode 80 and a spreading resistance which is of lower value than that of the diode 80. Similarly a diode 84 is also connected in parallel with the diodes 74, 80 and 82 and is a high power handling type device with a contact potential greater than the contact potential of the diode 82 and a spreading resistance of lower value than that of the diode 82. The barrier resistance of the combined parallel connected diodes 80, 82 and 84 has a value greater than the barrier resistance of the high sensitivity diode 74, so that the device 72 operates at high efficiency when low power signals are being detected by the device 72. The device 72 thus provides means whereby signals with power greater than those which can be handled by the device 10 may safely be handled without destruction of the high sensitivity diode 74 of the device 72.

The signal detecting device 86 schematically illustrated in FIGURE 11 is a modified form of the device 10 shown in FIGURE 1 and is most useful when handling high peak level radio frequency signals where burnout due to avalanche current following back breakdown is the problem.

In the device 86 a high sensitivity diode 88, such as the point contact type is connected between terminals 90 and 92, while a high power diode 94, which may be of the junction type is connected in parallel therewith. A second high power handling type diode 96 is connected in antiparallel with the diodes 88 and 94. Thus, while the anodes on the diodes 88 and 94 are connected to the terminal 90, the cathode of the diode 96 is connected to the terminal 90 and its anode is connected with the cathodes of the diodes 88 and 94 to the terminal 92.

The curve 98 of FIGURE 12 graphically illustrates the current voltage characteristic of the high sensitivity diode 88, while the curve 100 of FIGURE 13 illustrates the like characteristic for the high power diode 94. The curve 102 illustrates the current voltage characteristic of the antiparallel connected diode 96, while the curve 104 of FIGURE 15 provides the total current voltage characteristic for the device 86. The high current handling capabilities of the diodes 94 and 96 are respectively indicated at the end portions 106, 108 of the curve 104 for providing the device 86 with high power handling capabilities under reverse breakdown conditions.

It will be obvious to those skilled in the art that the invention may find wide application with appropriate modification to meet the individual design circumstances, but without substantial departure from the essence of the invention.

What is claimed is:

1. A signal amplitude modulation detecting device comprising first and second parallel connected operatively independent semiconductor diodes, the first diode having a signal sensitivity greater than that of said second diode while said second diode has a power handling capacity greater than that of said first diode, said combination of diodes providing a nonlinear voltage characteristic.

2. The device of claim 1 in which said first diode has a spreading resistance greater than that of said second diode.

3. The device of claim 1 in which said second diode has a contact potential and barrier resistance greater than the contact potential and barrier resistance respectively of said first diode.

4. The device of claim 1 in which said first diode has a spreading resistance greater than that of said second diode and said second diode has a contact potential and barrier resistance greater than the contact potential and barrier resistance respectively of said first diode.

5. The device of claim 4 in which said first diode handles a greater portion of signal power than said second diode when said device receives signals at a first predetermined power level, while said second diode handles a greater portion of signal power than said first diode when said device receives signals at a second predetermined power level greater than said first power level and without exceeding the power handling capability of said first diode.

6. A signal amplitude modulation detecting device comprising first and second semiconductor diodes each characterized by the following expression for current as a function of voltage applied across its external terminals $$i=I_0e^{-a\phi}[e^{a(V_o-ir_S)}-1]$$

where $i$, $V_o$ are the terminal current and voltage respectively, $\alpha$ is constant proportional to $q/KT$, $I_0$ is a constant of proportionality, $r_S$ is the series resistance of the device exclusive of the barrier resistance, and $\phi$ is the contact potential; said first and second diodes being operatively independent and connected in parallel and said second diode having a power handling capability greater than that of the said first diode.

7. The device of claim 6 in which said first diode has a resistance $r_{S1}$ greater than the resistance $r_{S2}$ of said second diode.

8. The device of claim 6 in which said second diode has a contact potential $\phi_2$ and barrier resistance $R_2$, greater than the contact potential $\phi_1$ and barrier resistance $R_1$ respectively of said first diode.

9. The device of claim 6 in which said first diode has a resistance $r_{S1}$ greater than the resistance $r_{S2}$ of said diode and said second diode has a contact potential $\phi_2$ and barrier resistance $R_2$ greater than the contact potential $\phi_1$ and barrier resistance $R_1$ respectively of said first diode.

10. The device of claim 9 in which in which the differential between the contact potentials of said second and first diodes $(\phi_2-\phi_1)$ has a value equal to or less than a predetermined maximum value so that said first diode handles a greater portion of signal power than said second diode when said device receives signals at a first predetermined power level, while said second diode handles a greater portion of signal power than said first diode when said device receives signals at a second predetermined power level greater than said first power level and without exceeding the power handling capability of said first diode.

11. A signal amplitude modulation detecting device comprising a first semiconductor diode and a plurality of second semiconductor diodes connected in parallel, said first diode being operatively independent from and having a signal sensitivity greater than those of said second diodes while said second diodes each having a different power handling capability which is greater than that of said first diode.

12. The device of claim 11 in which each of said second diodes has a different spreading resistance and said first diode has a spreading resistance greater than that of any one of said second diodes.

13. The device of claim 12 in which each of said second diodes has a different contact potential and said first diode has a contact potential and barrier resistance less than the contact potential and barrier resistance respectively of any one of said second diodes.

14. The device of claim 13 in which said first diode handles a greater portion of signal power than said second diodes when said device receives signals at a first predetermined power level, while said second diodes handle a greater portion of signal power than said first diode when said device receives signals at a second predetermined power level greater than said first power level and without exceeding the power handling capability of said first diode, power being shared among said second diodes at levels between said first and second power levels depending upon their respective values of contact potential, barrier resistances and spreading resistances.

15. A signal amplitude modulation detecting device comprising a first semiconductor diode, a second semiconductor diode connected in parallel with said first semiconductor diode, and a third semiconductor diode connected in antiparallel to said first diode being operatively independent from and, said first diode having a signal sensitivity greater than those of said second and third diodes while said second and third diodes each have a power handling capability which is greater than that of said first diode.

16. The device of claim 15 in which said second and third diodes each have a spreading resistance less than that of said first diode.

17. The device of claim 16 in which said second and third diodes each have a contact potential and barrier resistance greater than that of said first diode.

References Cited

UNITED STATES PATENTS

| | | | |
|---|---|---|---|
| 2,904,704 | 9/1959 | Marinace | 317—236 X |
| 2,981,876 | 4/1961 | Willemse | 317—234 |
| 3,140,452 | 7/1964 | Schmitz et al. | 317—235 |
| 3,241,079 | 3/1966 | Snell | 329—204 |
| 3,267,340 | 8/1966 | Regeffe | 317—234 |
| 3,312,838 | 4/1967 | Wallmark | 317—235 |

ALFRED L. BRODY, *Primary Examiner.*

U.S. Cl. X.R.

307—231, 317; 317—234, 235; 329—204

PO-1050
(5/69)

UNITED STATES PATENT OFFICE
CERTIFICATE OF CORRECTION

Patent No. 3,418,587 Dated December 24, 1968

Inventor(s) L. Riebman, et al.

It is certified that error appears in the above-identified patent and that said Letters Patent are hereby corrected as shown below:

Column 1, line 52, in TABLE 1, "Peak power watts (.001 duty cycle, 1 k sec.)" should read --Peak power watts (.001 duty cycle, 1$\mu$ sec.)--. Column 2, line 3, in TABLE 2, "Peak power watts (.001 duty cycle, 1 k sec.)" should read --Peak power watts (.001 duty cycle, 1$\mu$ sec.)--. Column 5, line 42, equation (1) should read -- $i = I_o e^{-\alpha\phi}\left[e^{\alpha(V_o - ir_s)} - 1\right]$ --. Column 5, line 61, equation (3a) should read -- $i_1 = I_1 e^{-\alpha\phi_1}\left[e^{\alpha(V_o - i_1 200)} - 1\right]$ --. Column 5, line 63, equation (3b) should read -- $i_2 = I_2 e^{-\alpha\phi_2}\left[e^{\alpha(V_o - i_2)} - 1\right]$ --. Column 6, line 2, equation should read --$\left[e^{\alpha(V - ir_s)} - 1\right] \cong \alpha(V_o - ir_s) \cong \alpha V_o$--. Column 10, line 28, equation should read -- $i = I_o e^{-\alpha\phi}\left[e^{\alpha(V_o - ir_s)} - 1\right]$ --.

SIGNED AND SEALED

MAR 17 1970

(SEAL)
Attest:

Edward M. Fletcher, Jr.
Attesting Officer

WILLIAM E. SCHUYLER, JR.
Commissioner of Patents